United States Patent
Dagan (10) Patent No.: US 11,659,720 B2
(45) Date of Patent: May 23, 2023

(54) SILICON OVER INSULATOR TWO-TRANSISTOR ONE-RESISTOR IN-SERIES RESISTIVE MEMORY CELL

(71) Applicant: Weebit Nano Ltd., Hod Hasharon (IL)

(72) Inventor: Lior Dagan, Tzafon (IL)

(73) Assignee: WEEBIT NANO LTD., Hod Hasharon (IL)

( * ) Notice: Subject to any disclaimer, the term of this patent is extended or adjusted under 35 U.S.C. 154(b) by 134 days.

(21) Appl. No.: 17/373,102

(22) Filed: Jul. 12, 2021

(65) Prior Publication Data

US 2022/0020815 A1 Jan. 20, 2022

Related U.S. Application Data

(60) Provisional application No. 63/052,111, filed on Jul. 15, 2020.

(51) Int. Cl.
*G11C 11/00* (2006.01)
*H01L 27/24* (2006.01)
*H01L 27/12* (2006.01)
*G11C 13/00* (2006.01)

(52) U.S. Cl.
CPC ........ *H01L 27/2436* (2013.01); *G11C 13/004* (2013.01); *G11C 13/0069* (2013.01); *H01L 27/1203* (2013.01); *G11C 2213/74* (2013.01); *G11C 2213/79* (2013.01)

(58) Field of Classification Search
CPC ............ G11C 13/0004; G11C 13/0069; G11C 2213/74; H01L 27/2436

USPC ........................................................ 365/148
See application file for complete search history.

(56) References Cited

U.S. PATENT DOCUMENTS

| | | |
|---|---|---|
| 5,637,513 A | 6/1997 | Sugiyama |
| 5,665,629 A | 9/1997 | Chen et al. |
| 6,606,263 B1 | 8/2003 | Tang |
| 7,935,619 B2 | 5/2011 | Jung et al. |
| 8,174,874 B2 | 5/2012 | Inaba |
| 8,233,308 B2 | 7/2012 | Schricker et al. |
| 8,981,328 B2 | 3/2015 | Greene et al. |
| 9,147,836 B2 | 9/2015 | Greene et al. |
| 9,165,610 B1 | 10/2015 | Poh et al. |
| 9,401,207 B2 * | 7/2016 | Roy ..................... G11C 14/009 |
| 9,478,273 B2 | 10/2016 | Dray et al. |
| 9,691,479 B1 | 6/2017 | Grafals et al. |
| 9,865,322 B2 | 1/2018 | Dray et al. |
| 9,889,086 B2 | 2/2018 | Bian et al. |
| 9,917,104 B1 | 3/2018 | Roizin et al. |
| 9,953,994 B2 | 4/2018 | Or-Bach et al. |
| 10,102,908 B2 | 10/2018 | Catthoor et al. |

(Continued)

*Primary Examiner* — Vu A Le
(74) *Attorney, Agent, or Firm* — M&B IP Analysts, LLC (57) ABSTRACT

A resistive random-access memory (ReRAM) array is provided. The ReRAM array includes a silicon over insulator (SOI) substrate; a first bit line; a first inverted bit line of the first bit line; a second bit line; a second inverted bit line of the second bit line; a first word line; a first inverted word line of the first word line; a first ReRAM cell comprising a first MOSFET, a second MOSFET, and a resistive element; and a second ReRAM cell comprising a first MOSFET, a second MOSFET, and a resistive element connected in series; wherein upon applying a predefined potential on elements of the first ReRAM cell, a state of the first ReRAM cell is adjusted without effecting a state of the second ReRAM.

22 Claims, 4 Drawing Sheets

(56) References Cited

U.S. PATENT DOCUMENTS

| | | |
|---|---|---|
| 10,934,163 B2 | 3/2021 | Leipold et al. |
| 2020/0135741 A1* | 4/2020 | Liaw ................. H01L 23/53209 |
| 2020/0152866 A1 | 5/2020 | Reznicek et al. |
| 2020/0161309 A1 | 5/2020 | Asami |
| 2020/0202924 A1* | 6/2020 | Intrater .............. G11C 13/0064 |

* cited by examiner

SILICON OVER INSULATOR TWO-TRANSISTOR ONE-RESISTOR IN-SERIES RESISTIVE MEMORY CELL

CROSS-REFERENCE TO RELATED APPLICATIONS

This application claims the benefit of U.S. Provisional Application No. 63/052,111 filed on Jul. 15, 2020, the contents of which are hereby incorporated by reference.

TECHNICAL FIELD

The disclosure generally relates to resistive random-access memory (ReRAM) cells, and more particularly to write to and read from two-transistor one-resistor (2T1R) class of ReRAM cells, and furthermore particularly to a ReRAM cell using a silicon-over-insulator implementation.

BACKGROUND

In the related art there are many types of known non-volatile random-access memory (RAM) cells. These kinds of memory cells allow the random access to each memory cell, or group of cells if so configured, and ensure that the data is retained in the memory cell even when power is lost. A certain class of these memory cells is known by the name resistive RAM (ReRAM) cells. In these cells data is stored by changing the resistance of a dielectric solid-state material. The process of operation of the ReRAM cell includes the forming of the cell which involves creating a filament which thereafter may be reset, or broken, for the purpose of creating a high resistance, or set, in fact reformed so that low resistance is achieved.

In the related art a variety of ReRAM cells may be found, typically of having a resistors-only crosspoint configuration, a configuration including a single transistor and a single resistor (1T1R), a configuration including a single transistor and two resistors (1T2R), and a configuration including two transistors and two resistors (2T2R). The first and most basic is the crosspoint configuration, where there are no transistors. Only a resistor is used to connect a word and a bit line. The leak paths which are formed in this configuration affect the accuracy of read operations of the 1R ReRAM cell in the crosspoint configuration array and is a major problem particularly at high temperatures.

In the 1T1R configuration a transistor is added to overcome the leak path problem, since all unselected word lines are isolated from the corresponding bit line and the leak paths are presented with a very high resistance path. This configuration, however, is costly in terms of area since most of the cell area is now occupied by a transistor. To overcome the significant area penalty of 1T1R, the 1TnR configuration is employed, where 'n' is an integer greater than '1'. The leakage is still lower than in the crosspoint configuration, but is not completely eliminated as in the 1T1R case. This is because of existing leak paths through the other (n−1) resistors which are connected to the same transistor. A compromise between the crosspoint and the 1T1R, the 1TnR achieves leak paths lower than crosspoint, at an area penalty that is not as high as in the 1T1R case.

In both 1T1R and 1T2R the endurance is limited, and the read window is known to be problematic. This is resolved with the 2T2R configuration, at an area penalty that is even higher than 1T2R. However, the differential reading gives a better operating window and reliability. In an array configuration using 1T1R ReRAM cells, each resistor is connected on one side to a bit line (BL), and on the other side to an inverted BL (BLb) controlled by a select transistor that is switched by a word line (WL). In practice, this configuration suffers from a small window separating "1" from "0" stored in the ReRAM cell. Therefore, aggressive programming (or writing) is required which in turn limits the endurance of the 1T1R ReRAM cell.

To overcome the limits of the 1T1R cell there appeared the 2T2R class of ReRAM cells. This enables differential read that in turn increases the window separating the '1' and '0' states. As a result, lesser aggressive programming is required resulting in better endurance that may be achieved. However, this does not come without a price as the tradeoff in this case is an increase in the overall memory area due to the additional transistor that has the dominant impact of the area size of the 2T2R ReRAM cell. In the related art, there also exists a limited number of 2T1R solutions that typically have the drains of two metal-oxide-silicon (MOS) transistors connected to each other and to the same port of the resistor device.

The problem for large ReRAM integration is the selector size and there are attempts to focus on exotic solutions for the reduction of the selector size. This results from the need to program in high voltages. A 4.8V metal-oxide semiconductor field-effect transistor (MOSFET) needs a minimal length ("L") of 500 nm which leads to impractically large array sizes.

It would therefore be desirable to provide a solution which uses a smaller selector while using non-exotic, well-studied circuit elements and manufacturing technologies, while overcoming the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a resistive random-access memory (ReRAM) cell comprising: a silicon over insulator (SOI) substrate; a first metal-oxide semiconductor field-effect transistor (MOSFET) formed on the SOI substrate having a drain port, a gate port, a source port, and a bulk port; a second MOSFET formed on the SOI substrate having a drain port, a gate port, a source port, and a bulk port; a resistive element formed on the SOI substrate having a first port and a second port; a word line connected to the gate port of the first MOSFET; an inverted word line of the word line connected to the gate port of the second MOSFET; a bit line; and an inverted bit line of the bit line; wherein the first MOSFET, the second MOSFET, and the resistive element are connected in series between the bit line and the inverted bit line; wherein upon applying a predefined potential at the bit line, the inverted bit line, the word line, the inverted word line, the bulk port of the first MOSFET, and the bulk port of the second MOSFET, a state of the ReRAM cell is determined.

Certain embodiments disclosed herein include a resistive random-access memory (ReRAM) array comprising: a silicon over insulator (SOI) substrate; a first bit line; a first inverted bit line of the first bit line; a second bit line; a second inverted bit line of the second bit line; a first word line; a first inverted word line of the first word line; a first ReRAM cell comprising a first MOSFET, a second MOSFET, and a resistive element; and a second ReRAM cell comprising a first MOSFET, a second MOSFET, and a resistive element connected in series; wherein upon applying a predefined potential on elements of the first ReRAM cell, a state of the first ReRAM cell is adjusted without effecting a state of the second ReRAM.

BRIEF DESCRIPTION OF THE DRAWINGS

The subject matter disclosed herein is particularly pointed out and distinctly claimed in the claims at the conclusion of the specification. The foregoing and other objects, features and advantages of the disclosure will be apparent from the following detailed description taken in conjunction with the accompanying drawings.

DETAILED DESCRIPTION

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

A resistive random-access memory (ReRAM) cell configured in a two-transistor and one-resistor (2T1R) configuration is formed using a silicon over insulator (SOI) technology and receives a first bit line (BLa), a second bit line (BLb), a first word line (WLa), and a second word line (WLb). The cell includes a first MOSFET, a second MOSFET, and a resistor connected in series. In one embodiment, elements are arranged in series in a transistor-resistor-transistor order, in another embodiment, in a resistor-transistor-transistor order, and in yet another embodiment, in a transistor-transistor-resistor order. The WLa is connected to the gate of a first MOSFET and the WLb is connected to the gate of a second MOSFET. The WLa is connected to a first port of the series element and the WLb is connected to a second port of the series element. In an embodiment, any one of the MOSFETs may be replaced by a plurality of MOSFETs connected in series.

Figure 1A:
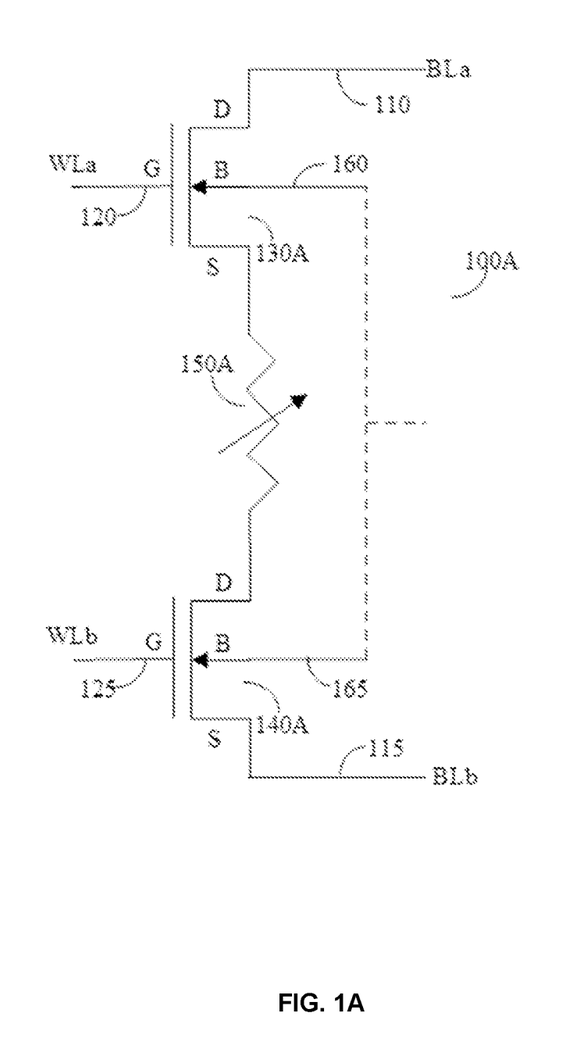
FIG. 1A is a schematic diagram of a silicon over insulator (SOI) resistive random-access memory (ReRAM) cell according to one embodiment.
Figure 1B:
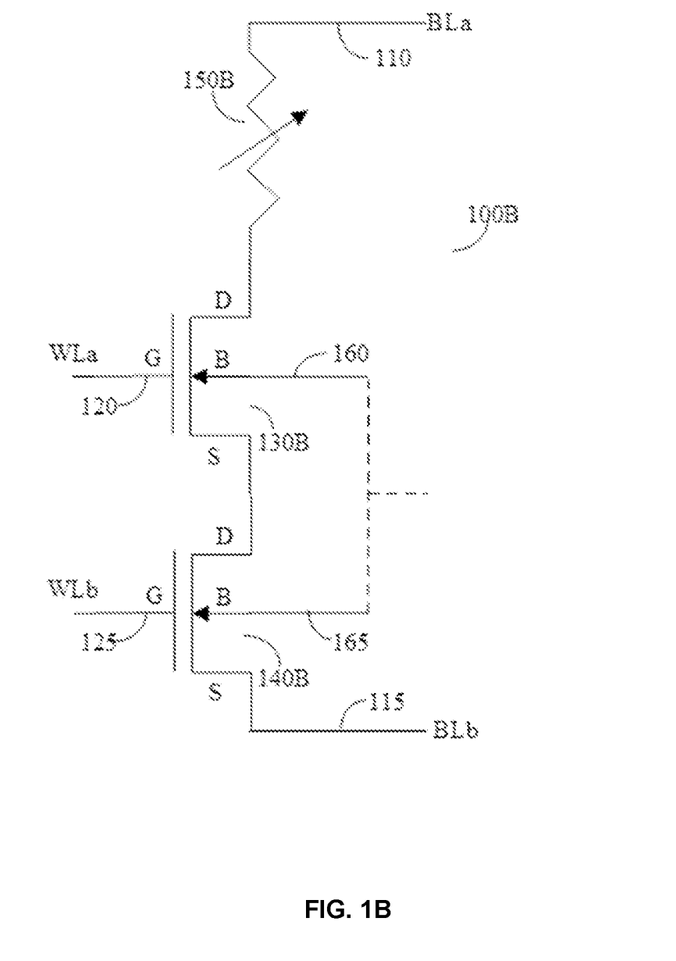
FIG. 1B is a schematic diagram of a SOI ReRAM cell according to another embodiment.
Figure 1C:
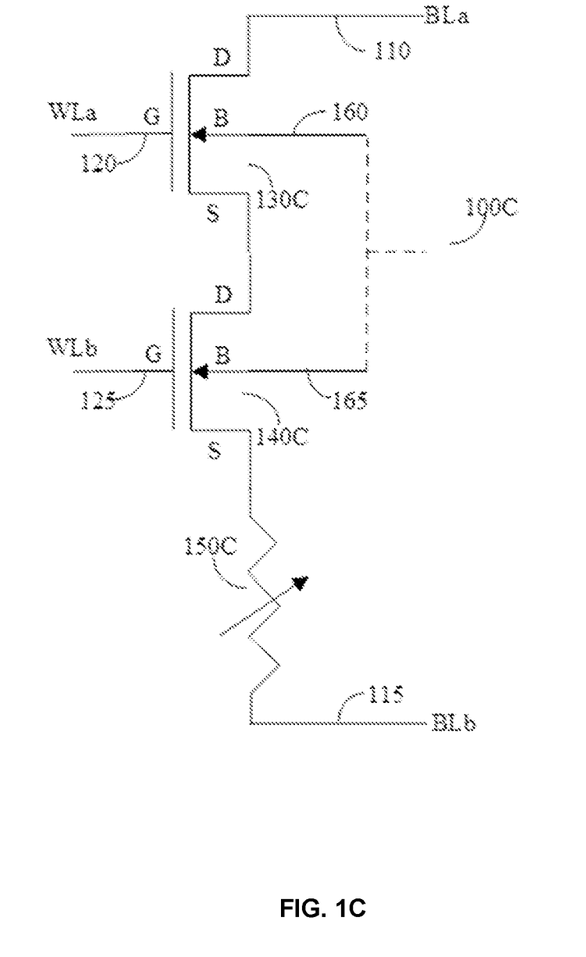
FIG. 1C is a schematic diagram of a SOI ReRAM cell according to yet another embodiment.

The disclosed embodiments present a ReRAM cell that includes the following components: a first MOSFET transistor, a second MOSFET transistor, and a resistive element that may be programmed in accordance with the principles of the embodiment. The components are connected in series as shown in FIG. 1A-1C. FIG. 1A shows a transistor-resistor-transistor (TRT) configuration, FIG. 1B shows a resistor-transistor-transistor (RTT) configuration, and FIG. 1C shows a transistor-transistor-resistor (TTR) configuration.

Specific order of the series connection may be selected depending on the target cell size as well as various cell design limitations of the technology. The cell is designed and implemented using a SOI technology where transistors are formed over an insulation layer. As SOI technology is well-known in the art, its characteristics are not discussed herein. However, those of ordinary skill in the art would appreciate the advantages of the SOI technology with respect of the disclosed ReRAM cell. While N-type MOSFETs are shown, the disclosed cell may be implemented using P-type MOSFETs with the necessary adaptation. It has been identified that many ReRAM configurations often require high voltage and result in large cell size. However, the above disclosed arrangement eliminates such need for high voltages. To this end, smaller transistors may be used to reduce cell size. For example, a 1.2V transistor may have a length ("L") of 90 nm while a 1V transistor may have L of 22 nm. This results in significantly small, and ever more practical ReRAM arrays. It should be noted that while the term "programming" is used herein, the term "writing" may and is frequently used to describe the same operation, i.e., updating the content of a memory cell.

FIG. 1A is an example schematic diagram of a SOI ReRAM cell 100A according to one embodiment. The ReRAM cell 100A includes two MOSFETs 130A and 140A of the same type, and a resistive element 150A that is programmed when operating the ReRAM cell 100A according to principles of operation further described herein. A TRT configuration is used such that the source of the MOSFET 130A is connected to a first port of the resistive element 150A and the drain of the MOSFET 140A is connected to the second port of the resistive element 150A. The WLa 120 is connected to the gate of MOSFET 130A and the WLb 125 is connected to the gate of MOSFET 140A. The drain of MOSFET 130A is connected to the BLa 110 and the source of the MOSFET 140A is connected to the inverted bit-line, also referred to as bit-line bar, BLb 115.

In an embodiment, each of the bulk ports 160 and 165 of MOSFETs 130A and 140A respectively may be connected to a different potential source. However, in another embodiment, such bulk ports may be connected to a single potential source that may typically be, for the SOI technology, in the range between 0V and 2.4V. Such configuration may save on the area of the cell while retaining the cell's performance as a ReRAM cell. More particularly, bulk ports 160 and 165 may be the same bulk port, or if separate bulks, they may be at the same potential. It should be noted that upon appropriately applying at least one predefined potential at the bit line, the inverted bit line, the word line, the inverted word line, the bulk port of the first MOSFET 130A, and the bulk port of the second MOSFET 140A, the state of the ReRAM cell is determined. The predefined potential may be determined by simulation, however in general, at these particular nanometric featured sizes, the potentials may be described as 0V, low (e.g., 1.2V) and high (e.g., 2.4V) voltages. Examples for the predefined potentials are provided in Tables 1 and 2, below.

FIG. 1B is an example schematic diagram of a SOI ReRAM cell 100B according to another embodiment. The ReRAM cell 100B includes two MOSFETs 130B and 140B of the same type, and a resistive element 150B that is programmed when operating the ReRAM cell 100B according to principles of operation further described herein. An RTT configuration is used such that a second port of the resistive element 150B is connected to the drain of the MOSFET 130B. The source of the MOSFET 130B is connected to the drain of the MOSFET 140B. The WLa 120 is connected to the gate of MOSFET 130B and the WLb 125 is connected to the gate of MOSFET 140B.

The first port of the resistive element 150B is connected to the BLa 110, while the source of the MOSFET 140B is connected to BLb 115. In an embodiment, each of the bulk ports 160 and 165 of MOSFETs 130B and 140B respectively may be connected to a different potential source. However, in another embodiment, MOSFETs 130B and 140B are connected to a single potential source that may typically be, for the SOI technology, in the range between 0V and 2.4V. Such configuration may save on the area of the cell while retaining the cell's performance as a ReRAM call. More particularly, bulk ports 160 and 165 may be the same bulk port, or if separate bulks, they may be at the same potential. It should be noted that upon appropriately applying at least one predefined potential at the bit line, the inverted bit line, the word line, the inverted word line, the bulk port of the first MOSFET 130B, and the bulk port of the second MOSFET 140B, the state of the ReRAM cell is determined. The predefined potential may be determined by simulation, however in general, at these particular nanometric featured sizes, the potentials may be described as 0V, low (e.g., 1.2V) and high (e.g., 2.4V) voltages. Examples for the predefined potentials are provided in Tables 3 and 4, below.

FIG. 1C is an example schematic diagram of a SOI ReRAM cell 100C according to yet another embodiment. The ReRAM cell 100C includes two MOSFETs 130C and 140C of the same type, and a resistive element 150C that is programmed when operating the ReRAM cell 100C according to principles of operation further described herein. A TTR configuration is used such that a first port of the resistive element 150C is connected to the source of the MOSFET 140C. The source of the MOSFET 130C is connected to the drain of the MOSFET 140C. The WLa 120 is connected to the gate of MOSFET 130C and the WLb 125 is connected to the gate of MOSFET 140C. The second port of the resistive element 150C is connected to the BLb 115, while the drain of the MOSFET 130C is connected to BLa 110. In an embodiment, each of the bulk ports 160 and 165 of MOSFETs 130C and 140C respectively may be connected to a different potential source. However, in another embodiment, these may be connected to a single potential source that can typically be, for the SOI technology, in the range between 0V and 2.4V. Such configuration may save on the area of the cell while retaining the cell's performance as a ReRAM call. More particularly, bulk ports 160 and 165 may be the same bulk port, or if separate bulks, they may be at the same potential. It should be noted that upon appropriately applying at least one predefined potential at the bit line, the inverted bit line, the word line, the inverted word line, the bulk port of the first MOSFET 130C, and the bulk port of the second MOSFET 140C, the state of the ReRAM cell is determined. The predefined potential may be determined by simulation, however in general, at these particular nanometric featured sizes, the potentials may be described as 0V, low (e.g., 1.2V) and high (e.g., 2.4V) voltages. Examples for the predefined potentials are provided in Tables 5 and 6, below.

Figure 2:
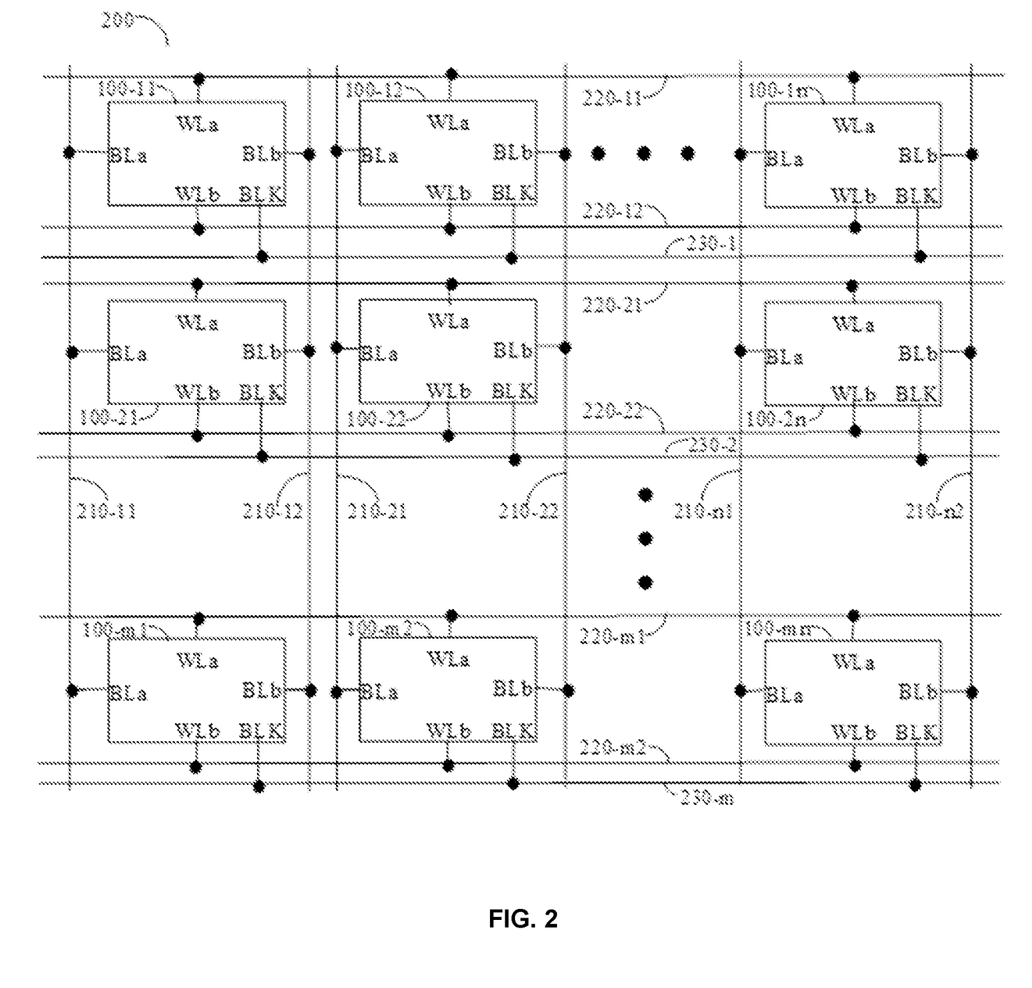
FIG. 2 is a schematic diagram of a ReRAM including of a plurality of SOI ReRAM cells according to an embodiment.

FIG. 2 is an example schematic diagram of a ReRAM array 200 including ReRAM cells 100A, 100B, or 100C according to an embodiment. Each cell is referred to with respect to FIG. 2 as a ReRAM cell 100. In the embodiment shown in FIG. 2, each of the ReRAM cells 100 has a BLa, BLb, WLa, WLb ports as well as a single bulk connection as it is assumed that the bulks of the two transistors are the same bulk or at the same bulk potential as explained herein. The ReRAM array 200 includes a plurality of ReRAM cells 100 that are organized in columns and rows.

The ReRAM array 200 includes 'n' columns, where 'n' is an integer equal to or greater than '1', and 'm' rows, where 'm' is an integer equal to or greater than '1'. A row of ReRAM memory cells 100 includes, for example, cells 100-11 through 100-1$n$. A column of ReRAM memory cells 100 includes, for example, cells 100-11 through 100-$m$1. ReRAM cell 100-11 is connected to BLa 210-11, BLb 210-12, and further to WLa 220-11 and WLb 220-12. Similarly, ReRAM cell 100-$mn$ is connected to BLa 210-$n$1, BLb 210-$n$2, and further to WLa 220-$m$1 and WLb 220-$m$2. For the purpose of programming (or writing) each ReRAM cell 100 potentials are appropriately applied, as shown herein, to the bit lines and the word lines for the operation of the array as further described herein.

It should be noted that simulation of the operation of the ReRAM cell shown in FIG. 1A, can be achieved by applying the example voltages now shown in Tables 1 and 2. In the case of a righthand operation, when a range is on 210-12 and 220-12 (see FIG. 2), their values must be identical. Furthermore, the post-pulse can be removed completely, as long as the abs($V_{GS}$), abs($V_{GD}$), and abs($V_{DS}$) on all array cells are no more than the safe operating area (SOA) limits, which are the voltage levels that will not damage any of the select transistors. When a voltage range, e.g., 0 to 1.2 volts, is used for each of 210-12 and 210-11 while at least one of the transistors is conducting, their values must be identical. Also, the post-pulse can be removed completely, as long as the abs($V_{GS}$), abs($V_{GD}$), and abs($V_{DS}$) on all array cells are no more than the SOA limit.

TABLE 1

| | values in volts | | | | | | | |
| --- | --- | --- | --- | --- | --- | --- | --- | --- |
| Mode | BL0 210-11 | BLb0 210-12 | BL1 210-21 | BLb1 210-22 | WLa 220-11 | WLb 220-12 | WLa 220-21 | WLb 220-22 |
| Before | 0 | 0 | 0 | 0 | 0 | 0 | 0 | 0 |
| Pre-write | 1.2-0 | 1.2-0 | 1.2 | 0 | 1.2 | 0 | 1.2 | 0 |
| Program | 1.2 | 1.2 | 2.4 | 0 | 1.2 | 0 | 2.4 | 1.2 |
| Post-write | 1.2-0 | 1.2-0 | 1.2-0 | 0 | 1.2-0 | 0 | 1.2-0 | 0 |
| After | 0 | 0 | 0 | 0 | 0 | 0 | 0 | 0 |

TABLE 2 values in volts

| Mode | BL0 210-11 | BLb0 210-12 | BL1 210-21 | BLb1 210-22 | WLa 220-11 | WLb 220-12 | WLa 220-21 | WLb 220-22 |
|---|---|---|---|---|---|---|---|---|
| Before | 0 | 0 | 0 | 0 | 0 | 0 | 0 | 0 |
| Pre-erase | 1.2-0 | 1.2-0 | 1.2-0 | 1.2 | 0 | 1.2 | 0 | 1.2 |
| Erase | 1.2 | 1.2 | 0 | 2.4 | 0 | 1.2 | 1.2 | 2.4 |
| Post-erase | 1.2-0 | 1.2-0 | 0 | 1.2-0 | 0 | 0 | 0 | 1.2-0 |
| After | 0 | 0 | 0 | 0 | 0 | 0 | 0 | 0 |

Simulation of the operation of the ReRAM cell shown in FIG. 1B can be performed by applying the voltage schemes shown in Tables 3 and 4. Other comments discussed herein regarding voltage range similarly apply.

TABLE 3 values in volts

| Mode | BL0 210-11 | BLb0 210-12 | BL1 210-21 | BLb1 210-22 | WLa 220-11 | WLb 220-12 | WLa 220-21 | WLb 220-22 |
|---|---|---|---|---|---|---|---|---|
| Before | 0 | 0 | 0 | 0 | 0 | 0 | 0 | 0 |
| Pre-write | 1.2-0 | 1.2-0 | 1.2 | 0 | 1.2 | 0 | 1.2 | 0 |
| Program | 1.2 | 1.2 | 2.4 | 0 | 1.2 | 0 | 1.2 | 1.2 |
| Post-write | 1.2-0 | 1.2-0 | 1.2-0 | 0 | 1.2 | 0 | 1.2 | 0 |
| After | 0 | 0 | 0 | 0 | 0 | 0 | 0 | 0 |

TABLE 4 values in volts

| Mode | BL 210-11 | BLb0 210-12 | BL1 210-21 | BLb1 210-22 | WLa 220-11 | WLb 220-12 | WLa 220-21 | WLb 220-22 |
|---|---|---|---|---|---|---|---|---|
| Before | 0 | 0 | 0 | 0 | 0 | 0 | 0 | 0 |
| Pre-erase | 1.2-0 | 1.2-0 | 0 | 1.2 | 0 | 1.2 | 0 | 1.2 |
| Erase | 1.2 | 1.2 | 0 | 2.4 | 0 | 1.2 | 2.4 | 2.4 |
| Post-erase | 1.2-0 | 1.2-0 | 0 | 1.2-0 | 1.2-0 | 0 | 0 | 1.2-0 |
| After | 0 | 0 | 0 | 0 | 0 | 0 | 0 | 0 |

Simulation of the operation of the ReRAM cell shown in FIG. 1C, can be performed by applying the voltage schemes shown in Tables 5 and 6. Other comments discussed herein regarding voltage range similarly apply.

TABLE 5 values in volts

| Mode | BL0 210-11 | BLb0 210-12 | Blb1 210-21 | BL1 210-22 | WLa 220-11 | WLb 220-12 | WLa 220-21 | WLb 220-22 |
|---|---|---|---|---|---|---|---|---|
| Before | 0 | 0 | 0 | 0 | 0 | 0 | 0 | 0 |
| Pre-erase | 1.2 | 1.2 | 1.2 | 0 | 0 | 1.2 | 1.2 | 0 |
| Erase | 1.2 | 1.2 | 2.4 | 0 | 0 | 1.2 | 1.2 | 1.2 |
| Post-erase | 1.2-0 | 1.2-0 | 1.2 | 0 | 0 | 1.2 | 1.2 | 0 |
| After | 0 | 0 | 0 | 0 | 0 | 0 | 0 | 0 |

TABLE 6

| Mode | BL0 210-11 | BlB0 210-12 | BlB1 210-21 | BL1 210-22 | WLa 220-11 | WLB 220-12 | WL 220-21 | WLB 220-22 |
|---|---|---|---|---|---|---|---|---|
| | | | | values in volts | | | | |
| Before | 0 | 0 | 0 | 0 | 0 | 0 | 0 | 0 |
| Pre-write | 1.2 | 1.2 | 0 | 1.2 | 0 | 1.2 | 0 | 1.2 |
| Program | 1.2 | 1.2 | 0 | 2.4 | 0 | 1.2 | 2.4 | 2.4 |
| Post-write | 1.2-0 | 1.2-0 | 0 | 1.2-0 | 0 | 1.2 | 0 | 1.2-0 |
| After | 0 | 0 | 0 | 0 | 0 | 0 | 0 | 0 |

It should be noted that the example voltage schemes provided in Tables 1-6 are provided for pedagogical purposes only and other schemes may be used for each of the TRT, RTT and TTR configurations shown in FIG. 1A-1C respectively and as applied within an array, like the example shown in FIG. 2.

In an embodiment, any of the MOSFETs 130 may be replaced by a plurality of MOSFETs connected in series. For example, if the MOSFET 130 is replaced by two MOSFET transistors, each having a drain port and a source port, then the first MOSFET source port is connected to the drain port of the second MOSFET, thus the drain port of the first MOSFET replaces the drain port of the MOSFET 130, and the source port of the second MOSFET replaces the source port of the MOSFET 130.

The bulks 160 of each of the first and the second MOSFET transistors that include the aggregated MOSFET 130 are, in an embodiment, a single bulk as further discussed herein. The gates of each of the first and second MOSFETs that include the aggregated MOSFET 130 are each connected to a separate word line (WLi) and receive signals to properly operate in this configuration. The advantage of such configuration is that it allows handling larger $V_{ds}$ and $V_{gs}$ voltages when small feature transistors are used that can handle lower voltages. It should be noted that such implementation is also applicable to the MOSFET 140.

According to the disclosed embodiments, a method of production of a ReRAM cell as well as the forming of a ReRAM array including a plurality of ReRAM cells is provided. The process of forming the cell over an SOI substrate is as follows. A first metal-oxide semiconductor field-effect transistor (MOSFET) is formed on the SOI substrate having a drain port, a gate port, a source port, and a bulk port. A second MOSFET is formed on the SOI substrate having a drain port, a gate port, a source port, and a bulk port. A resistive element is formed on the SOI substrate, potentially indirectly over the SOI substrate, having a first port and a second port. A word line connected to the gate port of the first MOSFET, an inverted word line of the word line connected to the gate port of the second MOSFET, a bit line and an inverted bit line are further formed. The method of forming is such that the first MOSFET, the second MOSFET, and the resistive element are connected in series between the bit line and the inverted bit line.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

What is claimed is:

1. A resistive random-access memory (ReRAM) cell comprising:
    a silicon over insulator (SOI) substrate;
    a first metal-oxide semiconductor field-effect transistor (MOSFET) formed on the SOI substrate having a drain port, a gate port, a source port, and a bulk port;
    a second MOSFET formed on the SOI substrate having a drain port, a gate port, a source port, and a bulk port;
    a resistive element formed on the SOI substrate having a first port and a second port;
    a word line connected to the gate port of the first MOSFET;
    an inverted word line of the word line connected to the gate port of the second MOSFET;
    a bit line; and
    an inverted bit line of the bit line;
    wherein the first MOSFET, the second MOSFET, and the resistive element are connected in series between the bit line and the inverted bit line;
    wherein upon applying a predefined potential at the bit line, the inverted bit line, the word line, the inverted word line, the bulk port of the first MOSFET, and the bulk port of the second MOSFET, a state of the ReRAM cell is determined.

2. The ReRAM cell of claim 1, wherein each of the first MOSFET and the second MOSFET is any of: an N-type and a P-type.

3. The ReRAM cell of claim 1, wherein the first MOSFET, the second MOSFET, and the resistive element connected in series between the bit line and the inverted bit line comprise: the drain port of the first MOSFET connected to the bit line, the source port of the first MOSFET connected to the first port of the resistive element, the second port of the resistive element connected to the drain of the second MOSFET, and the source port of the second MOSFET connected to the inverted bit line.

4. The ReRAM cell of claim 1, wherein the first MOSFET, the second MOSFET, and the resistive element connected in series between the bit line and the inverted bit line comprise: the first port of the resistive element connected to the bit line, the second port of the resistive element connected to the drain port of the first MOSFET, the source port of the first MOSFET connected to the drain of the second MOSFET, and the source port of the second MOSFET connected to the inverted bit line.

5. The ReRAM cell of claim 1, wherein the first MOSFET, the second MOSFET, and the resistive element connected in series between the bit line and the inverted bit line comprise: the drain port of the first MOSFET connected to the bit line, the source port of the first MOSFET connected to the drain of the second MOSFET, the source port of the second MOSFET connected to the first port of the resistive element, and the second port of the resistive element connected to the inverted bit line.

6. The ReRAM cell of claim 1, wherein the bulk port of the first MOSFET and the bulk port of the second MOSFET are the same bulk port.

7. The ReRAM cell of claim 1, wherein the bulk port of the first MOSFET and the bulk port of the second MOSFET are at the same potential.

8. The ReRAM cell of claim 1, wherein the first MOSFET comprises a plurality of MOSFETs connected in series.

9. The ReRAM cell of claim 1, wherein the second MOSFET comprises a plurality of MOSFETs connected in series.

10. A resistive random-access memory (ReRAM) array comprising:
   a silicon over insulator (SOI) substrate;
   a first bit line;
   a first inverted bit line of the first bit line;
   a second bit line;
   a second inverted bit line of the second bit line;
   a first word line;
   a first inverted word line of the first word line;
   a first ReRAM cell comprising a first MOSFET, a second MOSFET, and a resistive element; and
   a second ReRAM cell comprising a first MOSFET, a second MOSFET, and a resistive element connected in series; wherein upon applying a predefined potential on elements of the first ReRAM cell, a state of the first ReRAM cell is adjusted without effecting a state of the second ReRAM.

11. The ReRAM array of claim 10, wherein the first ReRAM cell further comprises: a bit line port, an inverted bit line port, a word line port, an inverted word line port, and a bulk port, wherein the bit line port of the first ReRAM is connected to the first bit line, the inverted bit line port is connected to the first inverted bit line, the word line port is connected to the first word line, and the inverted word line port is connected to the first inverted word line, and wherein the first MOSFET, the second MOSFET, and the resistive element are connected in series between the bit line port and the inverted bit line port.

12. The ReRAM array of claim 11, wherein the second ReRAM cell further comprises: a bit line port, an inverted bit line port, a word line port, an inverted bit line port, and a bulk port, wherein the bit line port of the second ReRAM is connected to the second bit line, the inverted bit line port is connected to the second inverted bit line, the word line port is connected to the first word line, and the inverted word line port is connected to the first inverted word line, wherein the first MOSFET, the second MOSFET, and the resistive element are connected in series between the bit line port and the inverted bit line port.

13. The ReRAM array of claim 12, wherein applying the predefined potential on elements of the first ReRAM cell further comprises:
   applying the predefined potential on at least the first bit line, the first inverted bit line, the first word line, and the first inverted word line, the state of the first ReRAM cell is adjusted without effecting the state of the second ReRAM.

14. The ReRAM array of claim 12, wherein the MOSFET of each of the first ReRAM cell and the second ReRAM cell is any one of: an N-type and a P-type.

15. The ReRAM array of claim 12, wherein the first MOSFET, the second MOSFET, and the resistive element of the ReRAM cell connected in series between the bit line and the inverted bit line comprise: the drain port of the first MOSFET connected to the bit line, the source port of the first MOSFET connected to the first port of the resistive element, the second port of the resistive element connected to the drain of the second MOSFET, and the source port of the second MOSFET connected to the inverted bit line.

16. The ReRAM array of claim 10, wherein the first MOSFET, the second MOSFET, and the resistive element of the ReRAM cell connected in series between the bit line and the inverted bit line comprise: the first port of the resistive element connected to the bit line, the second port of the resistive element connected to the drain port of the first MOSFET, the source port of the first MOSFET connected to the drain of the second MOSFET, and the source port of the second MOSFET connected to the inverted bit line.

17. The ReRAM array of claim 10, wherein the first MOSFET, the second MOSFET, and the resistive element of the ReRAM cell connected in series between the bit line and the inverted bit line comprise: the drain port of the first MOSFET connected to the bit line, the source port of the first MOSFET connected to the drain of the second MOSFET, the source port of the second MOSFET connected to the first port of the resistive element, and the second port of the resistive element connected to the inverted bit line.

18. The ReRAM array of claim 13, wherein the bulk port of the first ReRAM cell and the bulk port of the second ReRAM cell are the same bulk port.

19. The ReRAM array of claim 13, wherein the bulk port of the first ReRAM cell and the bulk port of the second ReRAM cell are at the same potential.

20. The ReRAM array of claim 10, further comprising:
   a third ReRAM cell comprising a first MOSFET, a second MOSFET, and a resistive element, the third ReRAM having a bit line port, an inverted bit line port, a word line port, an inverted word line port, and a bulk port, wherein the bit line port of the first ReRAM connected to the first bit line, the inverted bit line port connected to the first inverted bit line, a word line port connected to a second word line and the inverted word line port connected to a second inverted word line, and wherein the first MOSFET, the second MOSFET, and the resistive element are connected in series between the bit line port and the inverted bit line port.

21. The ReRAM array of claim 10, wherein the first MOSFET of each of the first ReRAM cell and the second ReRAM cell comprises a plurality of MOSFETs connected in series.

22. The ReRAM array of claim 10, wherein the second MOSFET of each of the first ReRAM cell and the second ReRAM cell comprises a plurality of MOSFETs connected in series.

\* \* \* \* \*